(12) United States Patent
Kim et al.

(10) Patent No.: US 8,818,318 B2
(45) Date of Patent: Aug. 26, 2014

(54) FREQUENCY UP AND DOWN CONVERTER

(75) Inventors: Young Jin Kim, Goyang-si (KR); Jin Young Lee, Suwon-si (KR); Soo Young Huh, Hanam-si (KR); Sung Yeong Son, Seongnam-si (KR); Sang Youb Lee, Hwaseong-si (KR); Jeonghoon Lee, Yongin-si (KR); Shin Ill Chang, Seoul (KR)

(73) Assignee: I&C Technology Co., Ltd., Seoul (KR)

( * ) Notice: Subject to any disclaimer, the term of this patent is extended or adjusted under 35 U.S.C. 154(b) by 130 days.

(21) Appl. No.: 13/481,186

(22) Filed: May 25, 2012

(65) Prior Publication Data

US 2012/0299633 A1 Nov. 29, 2012

(30) Foreign Application Priority Data

May 26, 2011 (KR) .................. 10-2011-0050335

(51) Int. Cl.
*H04B 1/28* (2006.01)
*H03D 7/14* (2006.01)
*H03D 7/16* (2006.01)

(52) U.S. Cl.
CPC ............ *H03D 7/165* (2013.01); *H03D 7/1466* (2013.01); *H03D 7/1441* (2013.01); *H03D 7/1458* (2013.01); *H03D 2200/0082* (2013.01)
USPC ........................... 455/318; 455/326; 455/333

(58) Field of Classification Search
USPC ............. 455/313, 314, 318, 323, 326, 333; 327/113, 119
See application file for complete search history.

(56) References Cited

U.S. PATENT DOCUMENTS

| 7,542,521 B2* | 6/2009 | Choi et al. ................ 375/316 |
| 2011/0065412 A1* | 3/2011 | Beffa ........................... 455/326 |
| 2013/0028356 A1* | 1/2013 | Heck et al. ................ 375/344 |

* cited by examiner

*Primary Examiner* — Nguyen Vo
(74) *Attorney, Agent, or Firm* — Kile Park Reed & Houtteman PLLC

(57) ABSTRACT

A frequency up and down converter, in which, when down converting a high frequency signal into an intermediate frequency signal or up converting an intermediate frequency signal into a high frequency signal by controlling switching elements using a local oscillator signal, a signal with a frequency to be converted is controlled a number of times during one cycle of the local oscillator signal, whereby the local oscillator signal with a frequency lower than an original frequency may be used. Transistors are added in parallel to switching transistors disposed in a frequency down conversion unit or a frequency up conversion unit, and local oscillator signals with predetermined phases and pulse widths are provided to the gates of the transistors such that a high frequency signal or an intermediate frequency signal is transferred to an output terminal at least two times during one cycle of a local oscillator signal.

4 Claims, 8 Drawing Sheets

FREQUENCY UP AND DOWN CONVERTER

BACKGROUND OF THE INVENTION

1. Field of the Invention

The present invention relates to a technology for up or down converting a frequency, and more particularly, to a frequency up and down converter which can up or down convert the frequency of an input signal using an oscillation signal with a frequency lower than an original frequency.

2. Description of the Related Art

In general, in a wireless communication system, in order to improve frequency selectivity characteristics for transmission and reception paths, frequency up and down converters for channels are needed for channel separation in an intermediate frequency (IF) analog frequency stage.

FIG. 1 is a block diagram of a conventional frequency down converter. Referring to FIG. 1, a conventional frequency down converter includes a frequency down conversion unit 110, a local oscillator signal generation unit 120, and a transimpedance amplification unit 130.

The frequency down conversion unit 110 has a single balanced frequency down converting section and a double balanced frequency down converting section. The frequency down conversion unit 110 includes a first mixer 110A and a second mixer 110B.

The first mixer 110A is configured to control and convert high frequency signals RF_INP and RF_INN inputted thereto, into I channel intermediate frequency signals by using local oscillator signals $LO_A$ and $LO_B$. The second mixer 110B is configured to control and convert the high frequency signals RF_INP and RF_INN into Q channel intermediate frequency signals IF_QP and IF_QN by using local oscillator signals $LO_C$ and $LO_D$.

The transimpedance amplification unit 130 includes a transimpedance amplifier TIA, resistors R1 and R2 and capacitors C1 and C2, and is configured to amplify the I channel intermediate frequency signals outputted from the first mixer 110A using the component elements. Accordingly, amplified type I channel intermediate frequency signals IF_IP and IF_IN are outputted from the transimpedance amplifier TIA.

The local oscillator signal generation unit 120 includes a plurality of local oscillator signal generators 121 to 124. The waveforms of the local oscillator signals inputted to and outputted from the local oscillator signal generators 121 to 124 are shown in FIG. 2.

Referring to FIG. 2, the local oscillator signal generators 121 to 124 receive pulse width modulated type local oscillator signals $LO_0$ and $LO_{270}$, $LO_{180}$ and $LO_{90}$, $LO_0$ and $LO_{90}$, and $LO_{180}$ and $LO_{270}$ with different phases, and generate pulse width modulated type local oscillator signals $LO_A$ and $LO_B$, and $LO_C$ and $LO_D$ with a duty ratio equal to or less than 50% and a phase difference of 180° to be used in the first mixer 110A and the second mixer 110B.

FIG. 3 is a block diagram of a conventional frequency up converter. Referring to FIG. 3, a conventional frequency up converter includes a frequency up conversion unit 310, a local oscillator signal generation unit 320, and a transimpedance amplifier 330.

The frequency up conversion unit 310 has a single balanced frequency up converting section and a double balanced frequency up converting section. The frequency up conversion unit 310 includes a first mixer 310A and a second mixer 310B.

The first mixer 310A is configured to control and convert I channel intermediate frequency signals IF_IP and IF_IN inputted thereto, into high frequency signals by using local oscillator signals $LO_A$ and $LO_B$. The second mixer 310B is configured to control and convert Q channel intermediate frequency signals IF_QP and IF_QN inputted thereto, into high frequency signals by using local oscillator signals $LO_C$ and $LO_D$.

The transimpedance amplifier 330 is configured to amplify the high frequency signals outputted from the common output terminals of the first mixer 310A and the second mixer 310B and output a positive polarity high frequency signal RF_OUTP and a negative polarity high frequency signal RF_OUTN.

The local oscillator signal generation unit 320 includes a plurality of local oscillator signal generators 321 to 324. The waveforms of the local oscillator signals inputted to and outputted from the local oscillator signal generators 321 to 324 are shown in FIG. 2.

Referring to FIG. 2, the local oscillator signal generators 321 to 324 receive local oscillator signals $LO_0$ and $LO_{270}$, $LO_{180}$ and $LO_{90}$, $LO_0$ and $LO_{90}$, and $LO_{180}$ and $LO_{270}$ with different phases, and generate local oscillator signals $LO_A$ and $LO_B$, and $LO_C$ and $LO_D$ with a duty ratio equal to or less than 50% and a phase difference of 180° to be used in the first mixer 310A and the second mixer 310B.

In the conventional frequency down converter, when converting high frequency signals into intermediate frequency signals, local oscillator signals with a frequency corresponding to the frequency of the high frequency signals to be converted are used. In this regard, as a mobile communication system recently trends toward the use of a higher frequency signal, it is difficult to provide local oscillator signals with a correspondingly high frequency.

Also, in the conventional frequency up converter, when converting intermediate frequency signals into high frequency signals, local oscillator signals with a high frequency corresponding to the frequency of the intermediate frequency signals are used. In this regard, as a mobile communication system recently trends toward the use of a higher frequency signal, it is difficult to provide local oscillator signals with a correspondingly high frequency.

SUMMARY OF THE INVENTION

Accordingly, the present invention has been made in an effort to solve the problems occurring in the related art, and an object of the present invention is to provide a frequency up and down converter, in which, when down converting a high frequency signal into an intermediate frequency signal or up converting an intermediate frequency signal into a high frequency signal by controlling switching elements using a local oscillator signal, a signal with a frequency to be converted is controlled a number of times during one cycle of the local oscillator signal, whereby the local oscillator signal with a frequency lower than an original frequency may be used.

In order to achieve the above object, according to one aspect of the present invention, there is provided a frequency down converter for single-balanced down converting a frequency of a high frequency signal and transferring the high frequency signal to output terminals of an I channel positive polarity intermediate frequency signal, an I channel negative polarity intermediate frequency signal, a Q channel positive polarity intermediate frequency signal and a Q channel negative polarity intermediate frequency signal, the frequency down converter including: a first mixer including a plurality of MOS transistors which are connected in parallel to transfer the high frequency signal to the output terminal of the I channel positive polarity intermediate frequency signal a number of times with a predetermined phase difference, and a plurality of MOS transistors which are connected in parallel to transfer the high frequency signal to the output terminal of the I channel negative polarity intermediate frequency signal a number of times with a predetermined phase difference; a second mixer including a plurality of MOS transistors which are connected in parallel to transfer the high frequency signal to the output terminal of the Q channel positive polarity intermediate frequency signal a number of times with a predetermined phase difference, and a plurality of MOS transistors which are connected in parallel to transfer the high frequency signal to the output terminal of the Q channel negative polarity intermediate frequency signal a number of times with a predetermined phase difference; and a local oscillator signal generation unit configured to provide local oscillator signals with preselected phases and pulse widths to respective gates of the pluralities of MOS transistors connected in parallel to transfer the high frequency signal to the output terminals of the I channel positive polarity intermediate frequency signal, the I channel negative polarity intermediate frequency signal, the Q channel positive polarity intermediate frequency signal and the Q channel negative polarity intermediate frequency signal through the pluralities of MOS transistors the number of times during one cycle of a local oscillator signal.

In order to achieve the above object, according to another aspect of the present invention, there is provided a frequency down converter for double-balanced down converting frequencies of a positive polarity high frequency signal and a negative polarity high frequency signal and transferring the high frequency signals to output terminals of an I channel positive polarity intermediate frequency signal, an I channel negative polarity intermediate frequency signal, a Q channel positive polarity intermediate frequency signal and a Q channel negative polarity intermediate frequency signal, the frequency down converter including: a first mixer including a plurality of MOS transistors which are connected in parallel to transfer the positive polarity high frequency signal to the output terminal of the I channel positive polarity intermediate frequency signal a number of times with a predetermined phase difference, a plurality of MOS transistors which are connected in parallel to transfer the positive polarity high frequency signal to the output terminal of the I channel negative polarity intermediate frequency signal a number of times with a predetermined phase difference; a plurality of MOS transistors which are connected in parallel to transfer the negative polarity high frequency signal to the output terminal of the I channel negative polarity intermediate frequency signal a number of times with a predetermined phase difference, and a plurality of MOS transistors which are connected in parallel to transfer the negative polarity high frequency signal to the output terminal of the I channel positive polarity intermediate frequency signal a number of times with a predetermined phase difference; a second mixer including a plurality of MOS transistors which are connected in parallel to transfer the positive polarity high frequency signal to the output terminal of the Q channel positive polarity intermediate frequency signal a number of times with a predetermined phase difference, a plurality of MOS transistors which are connected in parallel to transfer the positive polarity high frequency signal to the output terminal of the Q channel negative polarity intermediate frequency signal a number of times with a predetermined phase difference; a plurality of MOS transistors which are connected in parallel to transfer the negative polarity high frequency signal to the output terminal of the Q channel negative polarity intermediate frequency signal a number of times with a predetermined phase difference, and a plurality of MOS transistors which are connected in parallel to transfer the negative polarity high frequency signal to the output terminal of the Q channel positive polarity intermediate frequency signal a number of times with a predetermined phase difference; and a local oscillator signal generation unit configured to provide local oscillator signals with preselected phases and pulse widths to respective gates of the pluralities of MOS transistors connected in parallel to transfer the positive polarity high frequency signal and the negative polarity high frequency signal to the output terminals of the I channel positive polarity intermediate frequency signal, the I channel negative polarity intermediate frequency signal, the Q channel positive polarity intermediate frequency signal and the Q channel negative polarity intermediate frequency signal through the pluralities of MOS transistors the number of times during one cycle of a local oscillator signal.

In order to achieve the above object, according to still another aspect of the present invention, there is provided a frequency up converter for single-balanced up converting frequencies of an I channel positive polarity intermediate frequency signal, an I channel negative polarity intermediate frequency signal, a Q channel positive polarity intermediate frequency signal and a Q channel negative polarity intermediate frequency signal and transferring the signals to an output terminal of a high frequency signal, the frequency up converter including: a first mixer including a plurality of MOS transistors which are connected in parallel to transfer the I channel positive polarity intermediate frequency signal to the output terminal of the high frequency signal a number of times with a predetermined phase difference, and a plurality of MOS transistors which are connected in parallel to transfer the I channel negative polarity intermediate frequency signal to the output terminal of the high frequency signal a number of times with a predetermined phase difference; a second mixer including a plurality of MOS transistors which are connected in parallel to transfer the Q channel positive polarity intermediate frequency signal to the output terminal of the high frequency signal a number of times with a predetermined phase difference, and a plurality of MOS transistors which are connected in parallel to transfer the Q channel negative polarity intermediate frequency signal to the output terminal of the high frequency signal a number of times with a predetermined phase difference; and a local oscillator signal generation unit configured to provide local oscillator signals with preselected phases and pulse widths to respective gates of the pluralities of MOS transistors connected in parallel to transfer the I channel positive polarity intermediate frequency signal, the I channel negative polarity intermediate frequency signal, the Q channel positive polarity intermediate frequency signal and the Q channel negative polarity intermediate frequency signal to the output terminal of high frequency signal through the pluralities of MOS transistors the number of times during one cycle of a local oscillator signal.

In order to achieve the above object, according to yet still another aspect of the present invention, there is provided a frequency up converter for double-balanced up converting frequencies of an I channel positive polarity intermediate frequency signal, an I channel negative polarity intermediate frequency signal, a Q channel positive polarity intermediate frequency signal and a Q channel negative polarity intermediate frequency signal and transferring the signals to an output terminal of a positive polarity high frequency signal and an output terminal of a negative polarity high frequency signal, the frequency up converter including: a first mixer including a plurality of MOS transistors which are connected in parallel to transfer the I channel positive polarity intermediate frequency signal to the output terminal of the positive polarity high frequency signal a number of times with a predetermined phase difference, a plurality of MOS transistors which are connected in parallel to transfer the I channel positive polarity intermediate frequency signal to the output terminal of the negative polarity high frequency signal a number of times with a predetermined phase difference, a plurality of MOS transistors which are connected in parallel to transfer the I channel negative polarity intermediate frequency signal to the output terminal of the negative polarity high frequency signal a number of times with a predetermined phase difference, and a plurality of MOS transistors which are connected in parallel to transfer the I channel negative polarity intermediate frequency signal to the output terminal of the positive polarity high frequency signal a number of times with a predetermined phase difference; a second mixer including a plurality of MOS transistors which are connected in parallel to transfer the Q channel positive polarity intermediate frequency signal to the output terminal of the positive polarity high frequency signal a number of times with a predetermined phase difference, a plurality of MOS transistors which are connected in parallel to transfer the Q channel positive polarity intermediate frequency signal to the output terminal of the negative polarity high frequency signal a number of times with a predetermined phase difference, a plurality of MOS transistors which are connected in parallel to transfer the Q channel negative polarity intermediate frequency signal to the output terminal of the negative polarity high frequency signal a number of times with a predetermined phase difference, and a plurality of MOS transistors which are connected in parallel to transfer the Q channel negative polarity intermediate frequency signal to the output terminal of the positive polarity high frequency signal a number of times with a predetermined phase difference; and a local oscillator signal generation unit configured to provide local oscillator signals with preselected phases and pulse widths to respective gates of the pluralities of MOS transistors connected in parallel to transfer the I channel positive polarity intermediate frequency signal, the I channel negative polarity intermediate frequency signal, the Q channel positive polarity intermediate frequency signal and the Q channel negative polarity intermediate frequency signal to the output terminal of the positive polarity high frequency signal and the output terminal of the negative polarity high frequency signal through the pluralities of MOS transistors the number of times during one cycle of a local oscillator signal.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
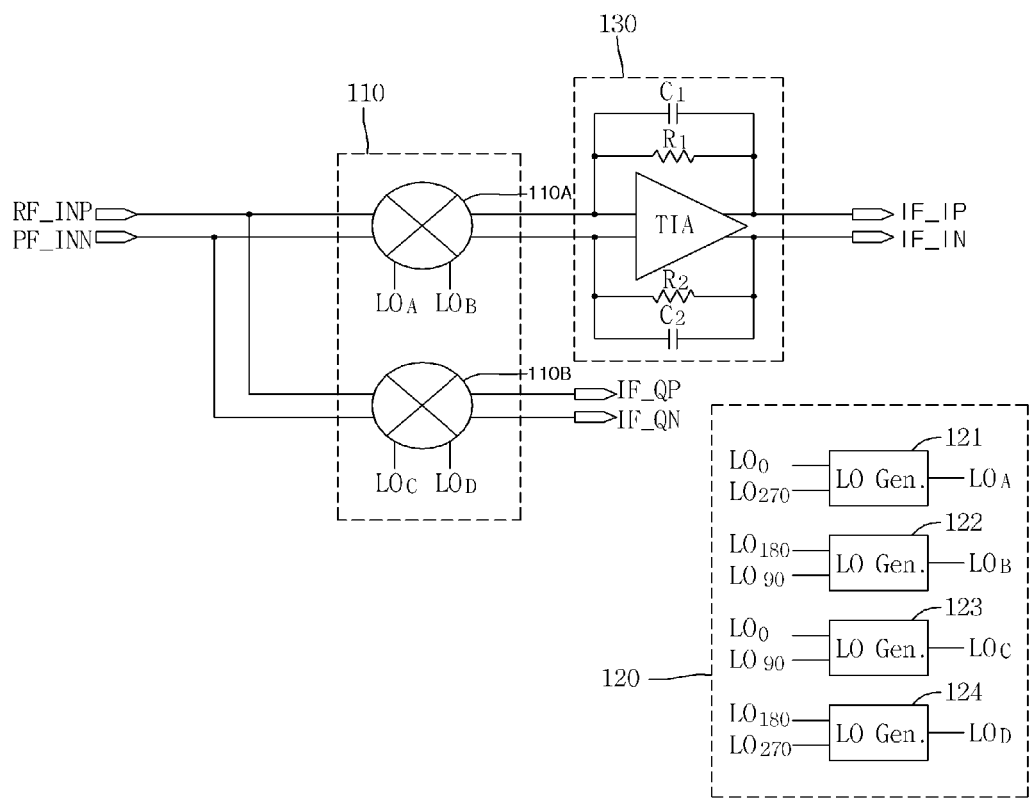
FIG. 1 is a block diagram of a conventional frequency down converter.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 4:
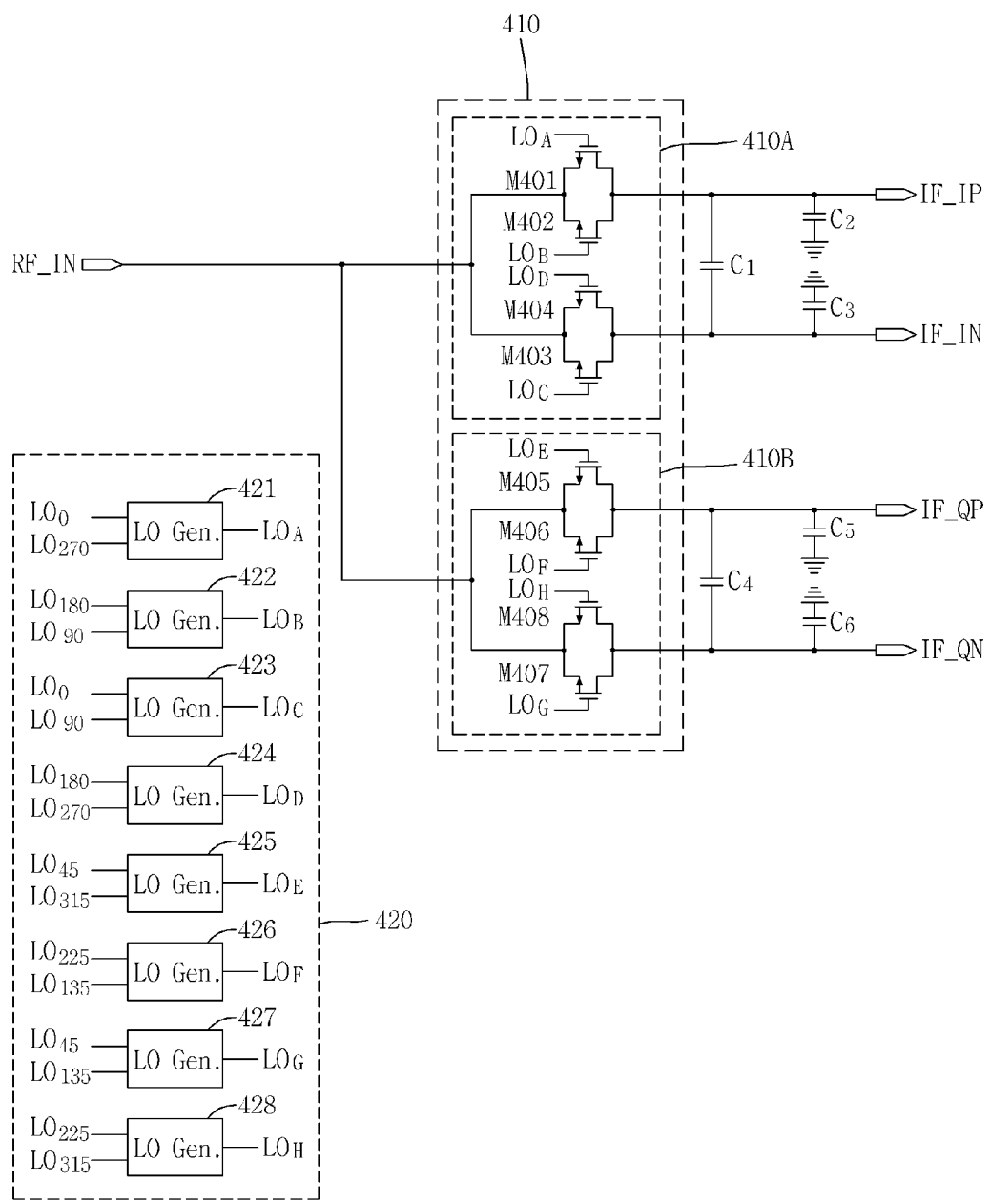
FIG. 4 is a block diagram of a single balanced frequency down converter in accordance with a first embodiment of the present invention.

FIG. 4 is a block diagram of a single balanced frequency down converter in accordance with a first embodiment of the present invention. In FIG. 4, a single balanced frequency down converter includes a frequency down conversion unit 410 having a first mixer 410A and a second mixer 410B and a local oscillator signal generation unit 420 having a plurality of local oscillator signal generators 421 to 428.

Referring to FIG. 4, the first mixer 410A includes a pair of first and second MOS transistors M401 and M402 which are sequentially switched and transfer a high frequency signal RF_IN to the output terminal of an I channel positive polarity intermediate frequency signal IF_IP, and a pair of third and fourth MOS transistors M403 and M404 which are sequentially switched and transfer the high frequency signal RF_IN to the output terminal of an I channel negative polarity intermediate frequency signal IF_IN.

One terminals and the other terminals of the first MOS transistor M401 and the second MOS transistor M402 are commonly connected with each other, and one common connection terminal is connected to the input terminal of the high frequency signal RF_IN and the other common connection terminal is connected to the output terminal of the I channel positive polarity intermediate frequency signal IF_IP. The gate of the first MOS transistor M401 is connected to the terminal of a local oscillator signal $LO_A$, and the gate of the second MOS transistor M402 is connected to the terminal of a local oscillator signal $LO_B$.

One terminals and the other terminals of the third MOS transistor M403 and the fourth MOS transistor M404 are commonly connected with each other, and one common connection terminal is connected to the input terminal of the high frequency signal RF_IN and the other common connection terminal is connected to the output terminal of the I channel negative polarity intermediate frequency signal IF_IN. The gate of the third MOS transistor M403 is connected to the terminal of a local oscillator signal $LO_C$, and the gate of the fourth MOS transistor M404 is connected to the terminal of a local oscillator signal $LO_D$.

The second mixer 410B includes a pair of fifth and sixth MOS transistors M405 and M406 which are sequentially switched and transfer the high frequency signal RF_IN to the output terminal of a Q channel positive polarity intermediate frequency signal IF_QP, and a pair of seventh and eighth MOS transistors M407 and M408 which are sequentially switched and transfer the high frequency signal RF_IN to the output terminal of a Q channel negative polarity intermediate frequency signal IF_QN.

One terminals and the other terminals of the fifth MOS transistor M405 and the sixth MOS transistor M406 are commonly connected with each other, and one common connection terminal is connected to the input terminal of the high frequency signal RF_IN and the other common connection terminal is connected to the output terminal of the Q channel positive polarity intermediate frequency signal IF_QP. The gate of the fifth MOS transistor M405 is connected to the terminal of a local oscillator signal $LO_E$, and the gate of the sixth MOS transistor M406 is connected to the terminal of a local oscillator signal $LO_F$.

One terminals and the other terminals of the seventh MOS transistor M407 and the eighth MOS transistor M408 are commonly connected with each other, and one common connection terminal is connected to the input terminal of the high frequency signal RF_IN and the other common connection terminal is connected to the output terminal of the Q channel negative polarity intermediate frequency signal IF_QN. The gate of the seventh MOS transistor M407 is connected to the terminal of a local oscillator signal $LO_G$, and the gate of the eighth MOS transistor M408 is connected to the terminal of a local oscillator signal $LO_H$.

The first local oscillator signal generator 421 is configured to be inputted with a local oscillator signal $LO_0$ with the phase of 0° and a local oscillator signal $LO_{270}$ with the phase of 270° and generate the local oscillator signal $LO_A$ with the phase of 0°. The second local oscillator signal generator 422 is configured to be inputted with a local oscillator signal $LO_{180}$ with the phase of 180° and a local oscillator signal $LO_{90}$ with the phase of 90° and generate the local oscillator signal $LO_B$ with the phase of 180°. The third local oscillator signal generator 423 is configured to be inputted with the local oscillator signal $LO_0$ with the phase of 0° and the local oscillator signal $LO_{90}$ with the phase of 90° and generate the local oscillator signal $LO_C$ with the phase of 90°. The fourth local oscillator signal generator 424 is configured to be inputted with the local oscillator signal $LO_{180}$ with the phase of 180° and the local oscillator signal $LO_{270}$ with the phase of 270° and generate the local oscillator signal $LO_D$ with the phase of 270°. The fifth local oscillator signal generator 425 is configured to be inputted with a local oscillator signal $LO_{45}$ with the phase of 45° and a local oscillator signal $LO_{315}$ with the phase of 315° and generate the local oscillator signal $LO_E$ with the phase of 45°. The sixth local oscillator signal generator 426 is configured to be inputted with a local oscillator signal $LO_{225}$ with the phase of 225° and a local oscillator signal $LO_{135}$ with the phase of 135° and generate the local oscillator signal $LO_F$ with the phase of 225°. The seventh local oscillator signal generator 427 is configured to be inputted with the local oscillator signal $LO_{45}$ with the phase of 45° and the local oscillator signal $LO_{135}$ with the phase of 135° and generate the local oscillator signal $LO_G$ with the phase of 135°. The eighth local oscillator signal generator 428 is configured to be inputted with the local oscillator signal $LO_{225}$ with the phase of 225° and the local oscillator signal $LO_{315}$ with the phase of 315° and generate the local oscillator signal $LO_H$ with the phase of 315°.

Figure 2:
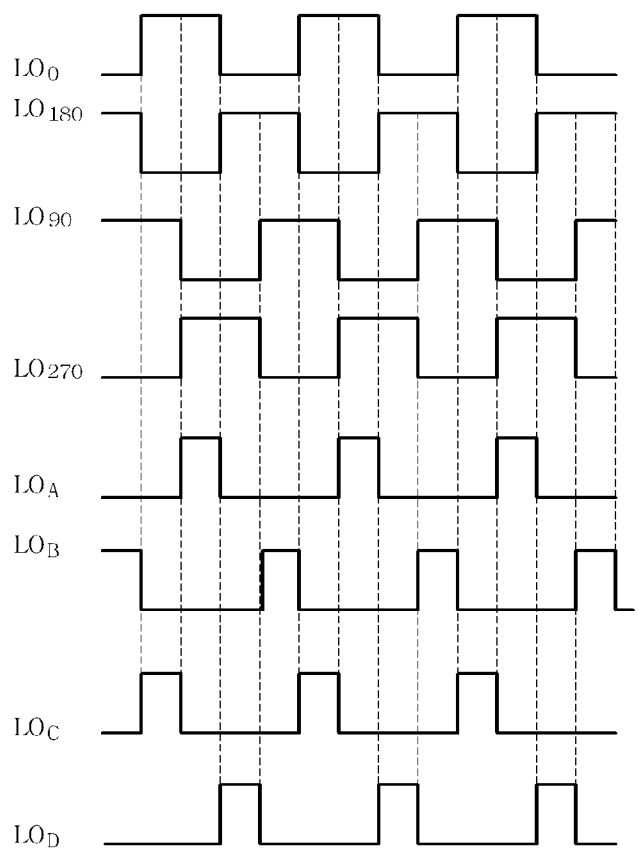
FIG. 2 is a waveform diagram of local oscillator signals outputted from the local oscillator signal generation unit shown in FIG. 1.
Figure 3:
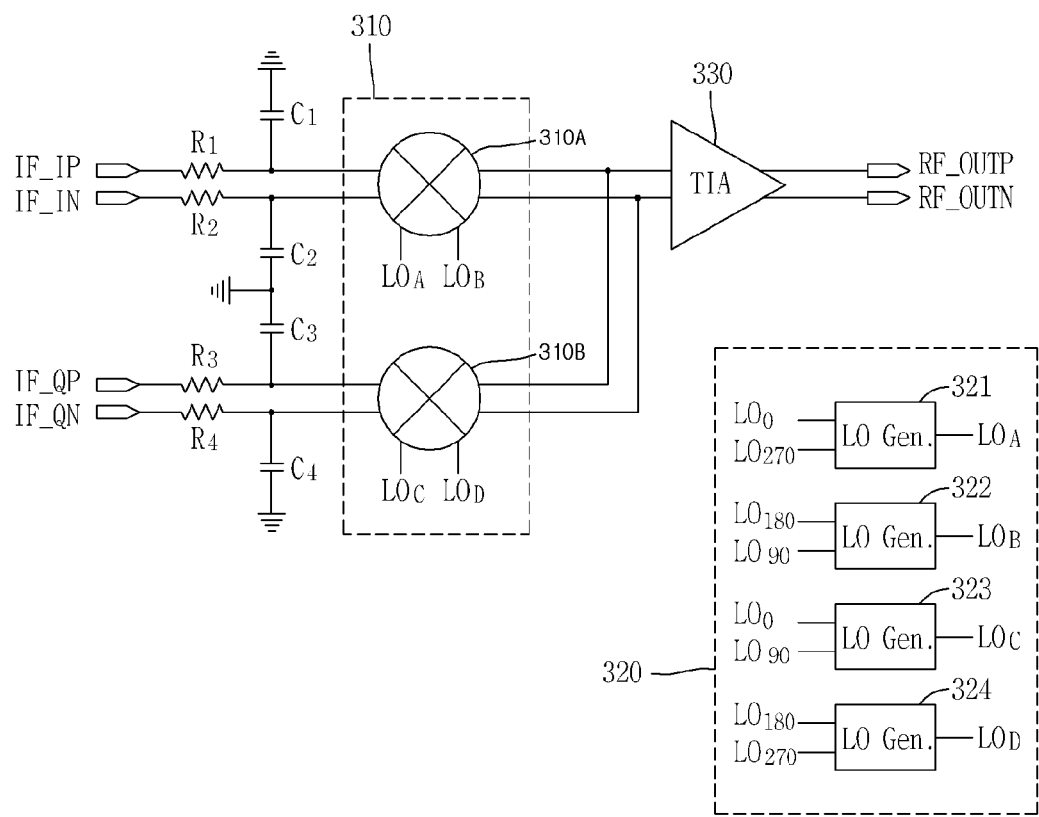
FIG. 3 is a block diagram of a conventional frequency up converter.

The local oscillator signal generation unit 420 generates the pulse width modulated type local oscillator signals as shown in FIG. 2. The four local oscillator signals $LO_0$, $LO_{90}$, $LO_{180}$ and $LO_{270}$ shown in FIG. 2 have the phase difference of 90° and the duty ratio of 50%. However, since the local oscillator signal generation unit 420 uses the eight local oscillator signals $LO_0$, $LO_{45}$, $LO_{90}$, $LO_{135}$, $LO_{180}$, $LO_{225}$, $LO_{270}$ and $LO_{315}$, these eight local oscillator signals have the phase difference of 45° and the duty ratio of 25%.

Therefore, the first MOS transistor M401 of the first mixer 410A is turned on by the local oscillator signal $LO_A$, and the high frequency signal RF_IN is transferred to the output terminal of the I channel positive polarity intermediate frequency signal IF_IP through the first MOS transistor M401. Thereafter, the second MOS transistor M402 of the first mixer 410A is turned on by the local oscillator signal $LO_B$, and the high frequency signal RF_IN is transferred to the output terminal of the I channel positive polarity intermediate frequency signal IF_IP through the second MOS transistor M402.

The third MOS transistor M403 of the first mixer 410A is turned on by the local oscillator signal $LO_C$, and the high frequency signal RF_IN is transferred to the output terminal of the I channel negative polarity intermediate frequency signal IF_IN through the third MOS transistor M403. Thereafter, the fourth MOS transistor M404 of the first mixer 410A is turned on by the local oscillator signal $LO_D$, and the high frequency signal RF_IN is transferred to the output terminal of the I channel negative polarity intermediate frequency signal IF_IN through the fourth MOS transistor M404.

The fifth MOS transistor M405 of the second mixer 410B is turned on by the local oscillator signal $LO_E$, and the high frequency signal RF_IN is transferred to the output terminal of the Q channel positive polarity intermediate frequency signal IF_QP through the fifth MOS transistor M405. Thereafter, the sixth MOS transistor M406 of the second mixer 410B is turned on by the local oscillator signal $LO_F$, and the high frequency signal RF_IN is transferred to the output terminal of the Q channel positive polarity intermediate frequency signal IF_QP through the sixth MOS transistor M406.

The seventh MOS transistor M407 of the second mixer 410B is turned on by the local oscillator signal $LO_G$, and the high frequency signal RF_IN is transferred to the output terminal of the Q channel negative polarity intermediate frequency signal IF_QN through the seventh MOS transistor M407. Thereafter, the eighth MOS transistor M408 of the second mixer 410B is turned on by the local oscillator signal $LO_H$, and the high frequency signal RF_IN is transferred to the output terminal of the Q channel negative polarity intermediate frequency signal IF_QN through the eighth MOS transistor M408.

In this way, during one cycle of a local oscillator signal LO, the high frequency signal RF_IN is transferred two times to each of the output terminals of the intermediate frequency signals IF_IP, IF_IN, IF_QP and IF_QN through each pair of pairs of MOS transistors M401 and M402, M403 and M404, M405 and M406, and M407 and M408 which perform switching operations. Accordingly, unlike the conventional single balanced frequency down conversion in which, during one cycle of the local oscillator signal LO, the high frequency signal RF_IN is transferred one time to each of the output terminals of the intermediate frequency signals IF_IP, IF_IN, IF_QP and IF_QN through a one corresponding MOS transistor, it is possible to perform single balanced frequency down conversion in the same way even by using a local oscillator signal with one half frequency.

While it was described above that the respective pairs of MOS transistors M401 and M402, M403 and M404, M405 and M406, and M407 and M408 are used in correspondence to the respective output terminals of the intermediate frequency signals IF_IP, IF_IN, IF_QP and IF_QN, it is to be noted that the present invention is not limited to such and an output signal with a higher frequency may be acquired using increased numbers of oscillators and switching MOS transistors by applying the same principle as described above.

Figure 5:
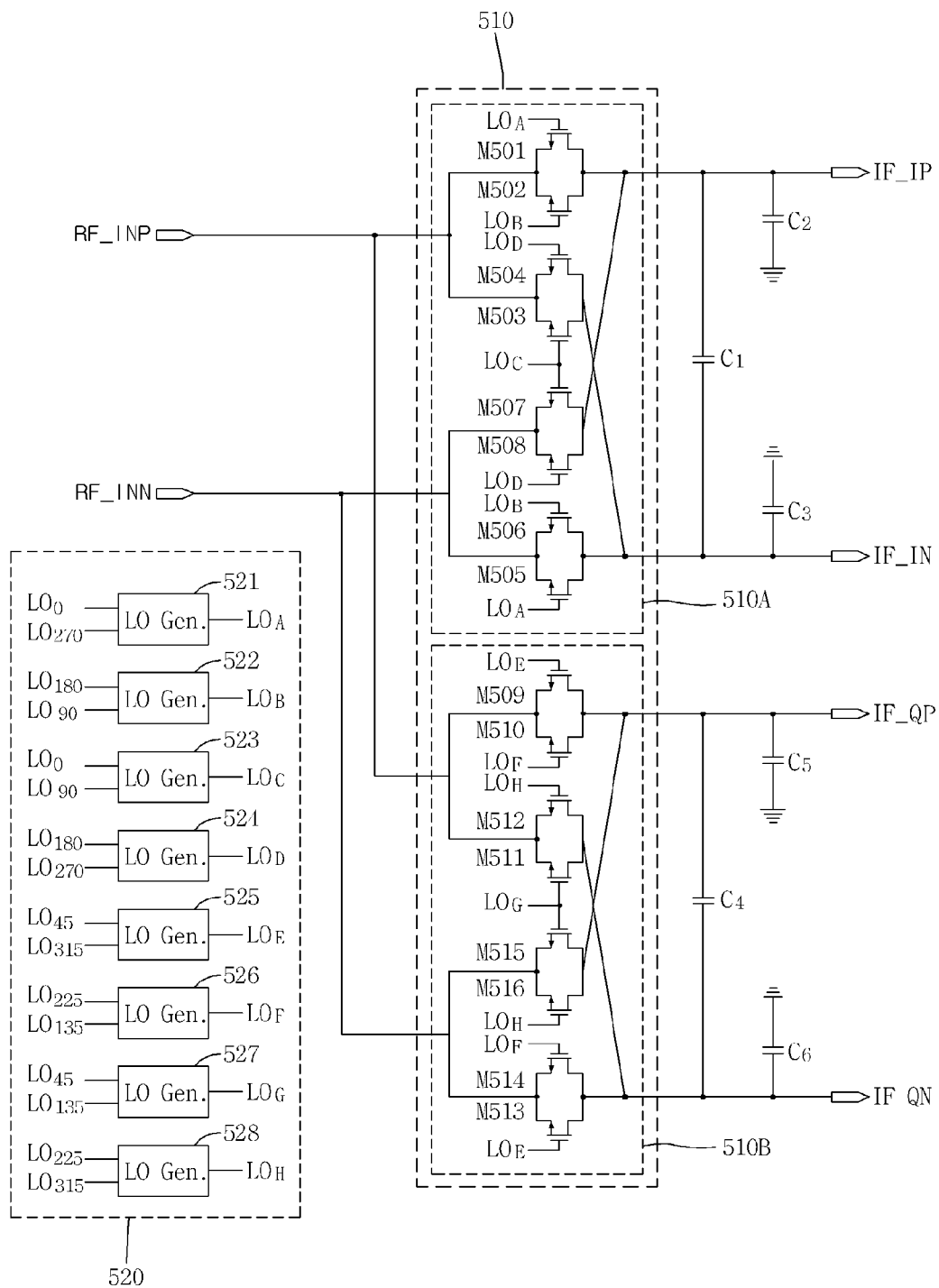
FIG. 5 is a block diagram of a double balanced frequency down converter in accordance with a second embodiment of the present invention.

FIG. 5 is a block diagram of a double balanced frequency down converter in accordance with a second embodiment of the present invention. In FIG. 5, a double balanced frequency down converter includes a frequency down conversion unit 510 having a first mixer 510A and a second mixer 510B and a local oscillator signal generation unit 520 having a plurality of local oscillator signal generators 521 to 528.

Referring to FIG. 5, the first mixer 510A includes a pair of first and second MOS transistors M501 and M502 which are sequentially switched and transfer a positive polarity high frequency signal RF_INP to the output terminal of an I channel positive polarity intermediate frequency signal IF_IP, a pair of third and fourth MOS transistors M503 and M504 which are sequentially switched and transfer the positive polarity high frequency signal RF_INP to the output terminal of an I channel negative polarity intermediate frequency signal IF_IN, a pair of fifth and sixth MOS transistors M505 and M506 which are sequentially switched and transfer a negative polarity high frequency signal RF_INN to the output terminal of the I channel negative polarity intermediate frequency signal IF_IN, and a pair of seventh and eighth MOS transistors M507 and M508 which are sequentially switched and transfer the negative polarity high frequency signal RF_INN to the output terminal of the I channel positive polarity intermediate frequency signal IF_IP.

One terminals and the other terminals of the first MOS transistor M501 and the second MOS transistor M502 are commonly connected with each other, and one common connection terminal is connected to the input terminal of the positive polarity high frequency signal RF_INP and the other common connection terminal is connected to the output terminal of the I channel positive polarity intermediate frequency signal IF_IP. The gate of the first MOS transistor M501 is connected to the terminal of a local oscillator signal $LO_A$, and the gate of the second MOS transistor M502 is connected to the terminal of a local oscillator signal $LO_B$.

One terminals and the other terminals of the third MOS transistor M503 and the fourth MOS transistor M504 are commonly connected with each other, and one common connection terminal is connected to the input terminal of the positive polarity high frequency signal RF_INP and the other common connection terminal is connected to the output terminal of the I channel negative polarity intermediate frequency signal IF_IN. The gate of the third MOS transistor M503 is connected to the terminal of a local oscillator signal $LO_C$, and the gate of the fourth MOS transistor M504 is connected to the terminal of a local oscillator signal $LO_D$.

One terminals and the other terminals of the fifth MOS transistor M505 and the sixth MOS transistor M506 are commonly connected with each other, and one common connection terminal is connected to the input terminal of the negative polarity high frequency signal RF_INN and the other common connection terminal is connected to the output terminal of the I channel negative polarity intermediate frequency signal IF_IN. The gate of the fifth MOS transistor M505 is connected to the terminal of the local oscillator signal $LO_A$, and the gate of the sixth MOS transistor M506 is connected to the terminal of the local oscillator signal $LO_B$.

One terminals and the other terminals of the seventh MOS transistor M507 and the eighth MOS transistor M508 are commonly connected with each other, and one common connection terminal is connected to the input terminal of the negative polarity high frequency signal RF_INN and the other common connection terminal is connected to the output terminal of the I channel positive polarity intermediate frequency signal IF_IP. The gate of the seventh MOS transistor M507 is connected to the terminal of the local oscillator signal $LO_C$, and the gate of the eighth MOS transistor M508 is connected to the terminal of the local oscillator signal $LO_D$.

The second mixer 510B includes a pair of ninth and tenth MOS transistors M509 and M510 which are sequentially switched and transfer the positive polarity high frequency signal RF_INP to the output terminal of a Q channel positive polarity intermediate frequency signal IF_QP, a pair of eleventh and twelfth MOS transistors M511 and M512 which are sequentially switched and transfer the positive polarity high frequency signal RF_INP to the output terminal of a Q channel negative polarity intermediate frequency signal IF_QN, a pair of thirteenth and fourteenth MOS transistors M513 and M514 which are sequentially switched and transfer the negative polarity high frequency signal RF_INN to the output terminal of the Q channel negative polarity intermediate frequency signal IF_QN, and a pair of fifteenth and sixteenth MOS transistors M515 and M516 which are sequentially switched and transfer the negative polarity high frequency signal RF_INN to the output terminal of the Q channel positive polarity intermediate frequency signal IF_QP.

One terminals and the other terminals of the ninth MOS transistor M509 and the tenth MOS transistor M510 are commonly connected with each other, and one common connection terminal is connected to the input terminal of the positive polarity high frequency signal RF_INP and the other common connection terminal is connected to the output terminal of the Q channel positive polarity intermediate frequency signal IF_QP. The gate of the ninth MOS transistor M509 is connected to the terminal of a local oscillator signal $LO_E$, and the gate of the tenth MOS transistor M510 is connected to the terminal of a local oscillator signal $LO_F$.

One terminals and the other terminals of the eleventh MOS transistor M511 and the twelfth MOS transistor M512 are commonly connected with each other, and one common connection terminal is connected to the input terminal of the positive polarity high frequency signal RF_INP and the other common connection terminal is connected to the output terminal of the Q channel negative polarity intermediate frequency signal IF_QN. The gate of the eleventh MOS transistor M511 is connected to the terminal of a local oscillator signal $LO_G$, and the gate of the twelfth MOS transistor M512 is connected to the terminal of a local oscillator signal $LO_H$.

One terminals and the other terminals of the thirteenth MOS transistor M513 and the fourteenth MOS transistor M514 are commonly connected with each other, and one common connection terminal is connected to the input terminal of the negative polarity high frequency signal RF_INN and the other common connection terminal is connected to the output terminal of the Q channel negative polarity intermediate frequency signal IF_QN. The gate of the thirteenth MOS transistor M513 is connected to the terminal of the local oscillator signal $LO_E$, and the gate of the fourteenth MOS transistor M514 is connected to the terminal of a local oscillator signal $LO_F$.

One terminals and the other terminals of the fifteenth MOS transistor M515 and the sixteenth MOS transistor M516 are commonly connected with each other, and one common connection terminal is connected to the input terminal of the negative polarity high frequency signal RF_INN and the other common connection terminal is connected to the output terminal of the Q channel positive polarity intermediate frequency signal IF_QP. The gate of the fifteenth MOS transistor M515 is connected to the terminal of the local oscillator signal $LO_G$, and the gate of the sixteenth MOS transistor M516 is connected to the terminal of a local oscillator signal $LO_H$.

The local oscillator signal generation unit 520 generates the local oscillator signals $LO_A$ to $LO_H$ of the same patterns as those generated by the local oscillator signal generation unit 420 of FIG. 4.

Therefore, the first MOS transistor M501 and the fifth MOS transistor M505 of the first mixer 510A are simultaneously turned on by the local oscillator signal $LO_A$. According to this fact, the positive polarity high frequency signal RF_INP is transferred to the output terminal of the I channel positive polarity intermediate frequency signal IF_IP through the first MOS transistor M501. At the same time, the negative polarity high frequency signal RF_INN is transferred to the output terminal of the I channel negative polarity intermediate frequency signal IF_IN through the fifth MOS transistor M505.

Thereafter, the second MOS transistor M502 and the sixth MOS transistor M506 are simultaneously turned on by the local oscillator signal $LO_B$. According to this fact, the positive polarity high frequency signal RF_INP is transferred to the output terminal of the I channel positive polarity intermediate frequency signal IF_IP through the second MOS transistor M502. At the same time, the negative polarity high frequency signal RF_INN is transferred to the output terminal of the I channel negative polarity intermediate frequency signal IF_IN through the sixth MOS transistor M506.

Then, the third MOS transistor M503 and the seventh MOS transistor M507 are simultaneously turned on by the local oscillator signal $LO_C$. According to this fact, the positive polarity high frequency signal RF_INP is transferred to the output terminal of the I channel negative polarity intermediate frequency signal IF_IN through the third MOS transistor M503. At the same time, the negative polarity high frequency signal RF_INN is transferred to the output terminal of the I channel positive polarity intermediate frequency signal IF_IP through the seventh MOS transistor M507.

Next, the fourth MOS transistor M504 and the eighth MOS transistor M508 are simultaneously turned on by the local oscillator signal $LO_D$. According to this fact, the positive polarity high frequency signal RF_INP is transferred to the output terminal of the I channel negative polarity intermediate frequency signal IF_IN through the fourth MOS transistor M504. At the same time, the negative polarity high frequency signal RF_INN is transferred to the output terminal of the I channel positive polarity intermediate frequency signal IF_IP through the eighth MOS transistor M508.

The ninth MOS transistor M509 and the thirteenth MOS transistor M513 of the second mixer 510B are simultaneously turned on by the local oscillator signal $LO_E$. According to this fact, the positive polarity high frequency signal RF_INP is transferred to the output terminal of the Q channel positive polarity intermediate frequency signal IF_QP through the ninth MOS transistor M509. At the same time, the negative polarity high frequency signal RF_INN is transferred to the output terminal of the Q channel negative polarity intermediate frequency signal IF_QN through the thirteenth MOS transistor M513.

Thereafter, the tenth MOS transistor M510 and the fourteenth MOS transistor M514 are simultaneously turned on by the local oscillator signal $LO_F$. According to this fact, the positive polarity high frequency signal RF_INP is transferred to the output terminal of the Q channel positive polarity intermediate frequency signal IF_QP through the tenth MOS transistor M510. At the same time, the negative polarity high frequency signal RF_INN is transferred to the output terminal of the Q channel negative polarity intermediate frequency signal IF_QN through the fourteenth MOS transistor M514.

Then, the eleventh MOS transistor M511 and the fifteenth MOS transistor M515 are simultaneously turned on by the local oscillator signal $LO_G$. According to this fact, the positive polarity high frequency signal RF_INP is transferred to the output terminal of the Q channel negative polarity intermediate frequency signal IF_QN through the eleventh MOS transistor M511. At the same time, the negative polarity high frequency signal RF_INN is transferred to the output terminal of the Q channel positive polarity intermediate frequency signal IF_QP through the fifteenth MOS transistor M515.

Next, the twelfth MOS transistor M512 and the sixteenth MOS transistor M516 are simultaneously turned on by the local oscillator signal $LO_H$. According to this fact, the positive polarity high frequency signal RF_INP is transferred to the output terminal of the Q channel negative polarity intermediate frequency signal IF_QN through the twelfth MOS transistor M512. At the same time, the negative polarity high frequency signal RF_INN is transferred to the output terminal of the Q channel positive polarity intermediate frequency signal IF_QP through the sixteenth MOS transistor M516.

In this way, during one cycle of a local oscillator signal LO, each of the positive polarity high frequency signal RF_INP and the negative polarity high frequency signal RF_INN is transferred two times to each of the output terminals of the I channel intermediate frequency signals IF_IP and IF_IN through each pair of four pairs of MOS transistors M501 and M502, M503 and M504, M505 and M506, and M507 and M508, and is transferred two times to each of the output terminals of the Q channel intermediate frequency signals IF_QP and IF_QN through each pair of the other four pairs of MOS transistors M509 and M510, M511 and M512, M513 and M514, and M515 and M516.

Accordingly, unlike the conventional double balanced frequency down conversion in which, during one cycle of the local oscillator signal LO, each of the positive polarity high frequency signal RF_INP and the negative polarity high frequency signal RF_INN is transferred one time to each of the output terminals of the intermediate frequency signals IF_IP, IF_IN, IF_QP and IF_QN through a one corresponding MOS transistor, it is possible to perform double balanced frequency down conversion in the same way even by using a local oscillator signal with one half frequency.

While it was described above that the respective pairs of MOS transistors M501 and M502, M503 and M504, M505 and M506, M507 and M508, M509 and M510, M511 and M512, M513 and M514, and M515 and M516 are used in correspondence to the respective output terminals of the intermediate frequency signals IF_IP, IF_IN, IF_QP and IF_QN, it is to be noted that the present invention is not limited to such and an output signal with a higher frequency may be acquired using increased numbers of oscillators and switching MOS transistors by applying the same principle as described above.

Figure 6:
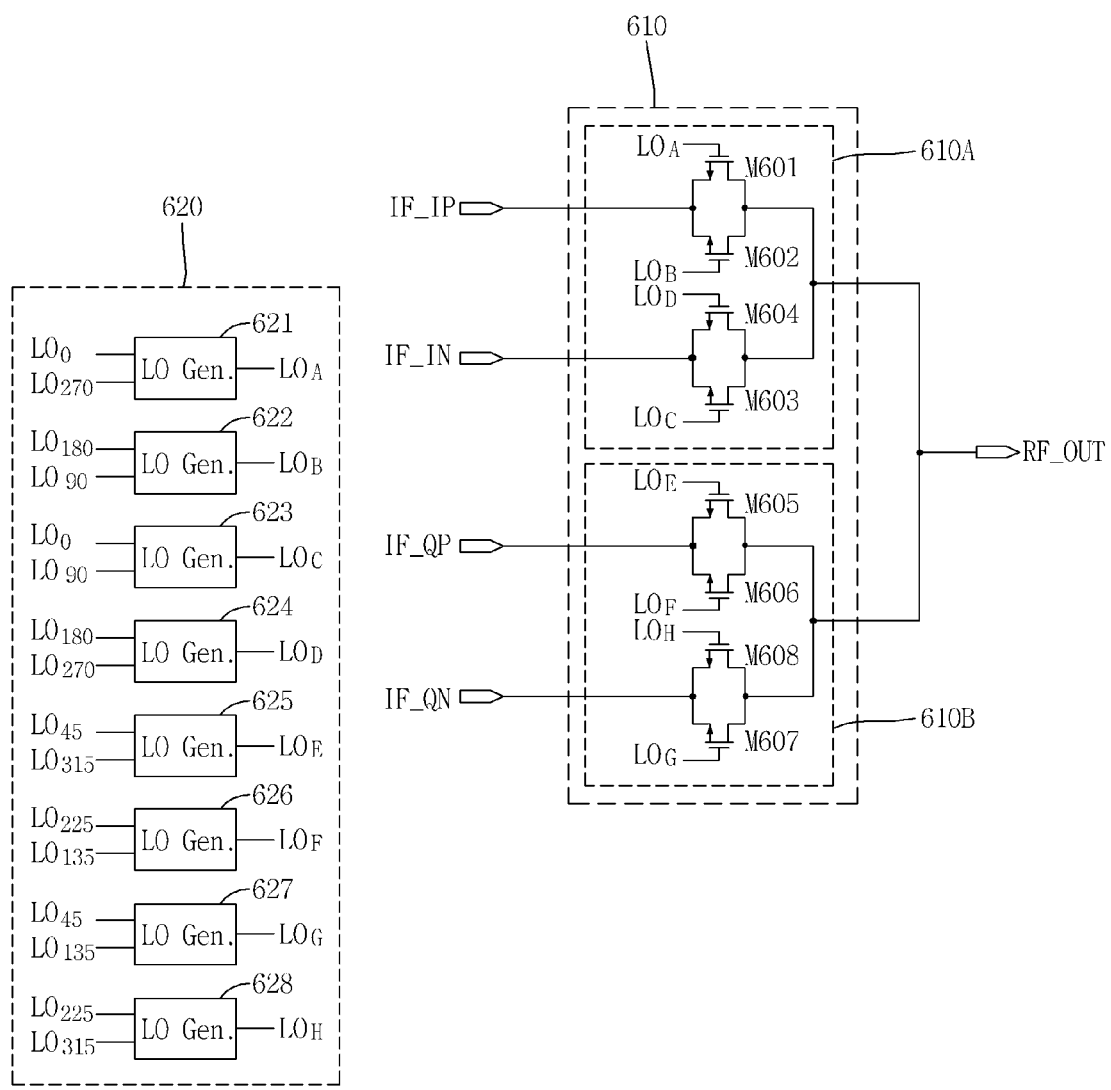
FIG. 6 is a block diagram of a single balanced frequency up converter in accordance with a third embodiment of the present invention.

FIG. 6 is a block diagram of a single balanced frequency up converter in accordance with a third embodiment of the present invention. In FIG. 6, a single balanced frequency up converter includes a frequency up conversion unit 610 having a first mixer 610A and a second mixer 610B and a local oscillator signal generation unit 620 having a plurality of local oscillator signal generators 621 to 628.

Referring to FIG. 6, the first mixer 610A includes a pair of first and second MOS transistors M601 and M602 which are sequentially switched and transfer an I channel positive polarity intermediate frequency signal IF_IP to the output terminal of a high frequency signal RF_OUT, and a pair of third and fourth MOS transistors M603 and M604 which are sequentially switched and transfer an I channel negative polarity intermediate frequency signal IF_IN to the output terminal of the high frequency signal RF_OUT.

One terminals and the other terminals of the first MOS transistor M601 and the second MOS transistor M602 are commonly connected with each other, and one common connection terminal is connected to the input terminal of the I channel positive polarity intermediate frequency signal IF_IP and the other common connection terminal is connected to the output terminal of the high frequency signal RF_OUT. The gate of the first MOS transistor M601 is connected to the terminal of a local oscillator signal $LO_A$, and the gate of the second MOS transistor M602 is connected to the terminal of a local oscillator signal $LO_B$.

One terminals and the other terminals of the third MOS transistor M603 and the fourth MOS transistor M604 are commonly connected with each other, and one common connection terminal is connected to the input terminal of the I channel negative polarity intermediate frequency signal IF_IN and the other common connection terminal is connected to the output terminal of the high frequency signal RF_OUT. The gate of the third MOS transistor M603 is connected to the terminal of a local oscillator signal $LO_C$, and the gate of the fourth MOS transistor M604 is connected to the terminal of a local oscillator signal $LO_D$.

The second mixer 610B includes a pair of fifth and sixth MOS transistors M605 and M606 which are sequentially switched and transfer a Q channel positive polarity intermediate frequency signal IF_QP to the output terminal of the high frequency signal RF_OUT, and a pair of seventh and eighth MOS transistors M607 and M608 which are sequentially switched and transfer a Q channel negative polarity intermediate frequency signal IF_QN to the output terminal of the high frequency signal RF_OUT.

One terminals and the other terminals of the fifth MOS transistor M605 and the sixth MOS transistor M606 are commonly connected with each other, and one common connection terminal is connected to the input terminal of the Q channel positive polarity intermediate frequency signal IF_QP and the other common connection terminal is connected to the output terminal of the high frequency signal RF_OUT. The gate of the fifth MOS transistor M605 is connected to the terminal of a local oscillator signal $LO_E$, and the gate of the sixth MOS transistor M606 is connected to the terminal of a local oscillator signal $LO_F$.

One terminals and the other terminals of the seventh MOS transistor M607 and the eighth MOS transistor M608 are commonly connected with each other, and one common connection terminal is connected to the input terminal of the Q channel negative polarity intermediate frequency signal IF_QN and the other common connection terminal is connected to the output terminal of the high frequency signal RF_OUT. The gate of the seventh MOS transistor M607 is connected to the terminal of a local oscillator signal $LO_G$, and the gate of the eighth MOS transistor M608 is connected to the terminal of a local oscillator signal $LO_H$.

The local oscillator signal generation unit 620 generates the local oscillator signals $LO_A$ to $LO_H$ of the same patterns as those generated by the local oscillator signal generation unit 420 of FIG. 4.

Therefore, the first MOS transistor M601 of the first mixer 610A is turned on by the local oscillator signal $LO_A$, and the I channel positive polarity intermediate frequency signal IF_IP is transferred to the output terminal of the high frequency signal RF_OUT through the first MOS transistor M601. Thereafter, the second MOS transistor M602 of the first mixer 610A is turned on by the local oscillator signal $LO_B$, and the I channel positive polarity intermediate frequency signal IF_IP is transferred to the output terminal of the high frequency signal RF_OUT through the second MOS transistor M602.

The third MOS transistor M603 of the first mixer 610A is turned on by the local oscillator signal $LO_C$, and the I channel negative polarity intermediate frequency signal IF_IN is transferred to the output terminal of the high frequency signal RF_OUT through the third MOS transistor M603. Thereafter, the fourth MOS transistor M604 of the first mixer 610A is turned on by the local oscillator signal $LO_D$, and the I channel negative polarity intermediate frequency signal IF_IN is transferred to the output terminal of the high frequency signal RF_OUT through the fourth MOS transistor M604.

The fifth MOS transistor M605 of the second mixer 610B is turned on by the local oscillator signal $LO_E$, and the Q channel positive polarity intermediate frequency signal IF_QP is transferred to the output terminal of the high frequency signal RF_OUT through the fifth MOS transistor M605. Thereafter, the sixth MOS transistor M606 of the second mixer 610B is turned on by the local oscillator signal $LO_F$, and the Q channel positive polarity intermediate frequency signal IF_QP is transferred to the output terminal of the high frequency signal RF_OUT through the sixth MOS transistor M606.

The seventh MOS transistor M607 of the second mixer 610B is turned on by the local oscillator signal $LO_G$, and the Q channel negative polarity intermediate frequency signal IF_QN is transferred to the output terminal of the high frequency signal RF_OUT through the seventh MOS transistor M607. Thereafter, the eighth MOS transistor M608 of the second mixer 610B is turned on by the local oscillator signal $LO_H$, and the Q channel negative polarity intermediate frequency signal IF_QN is transferred to the output terminal of the high frequency signal RF_OUT through the eighth MOS transistor M608.

In this way, during one cycle of a local oscillator signal LO, each of the intermediate frequency signals IF_IP, IF_IN, IF_QP and IF_QN is transferred two times to the output terminal of the high frequency signal RF_OUT through each pair of pairs of MOS transistors M601 and M602, M603 and M604, M605 and M606, and M607 and M608 which perform switching operations. Accordingly, unlike the conventional single balanced frequency up conversion in which, during one cycle of the local oscillator signal LO, each of the intermediate frequency signals IF_IP, IF_IN, IF_QP and IF_QN is transferred one time to the output terminal of the high frequency signal RF_OUT through a one corresponding MOS transistor, it is possible to perform single balanced frequency up conversion in the same way even by using a local oscillator signal with one half frequency.

While it was described above that the respective pairs of MOS transistors M601 and M602, M603 and M604, M605 and M606, and M607 and M608 are used in correspondence to the respective terminals of the intermediate frequency signals IF_IP, IF_IN, IF_QP and IF_QN, it is to be noted that the present invention is not limited to such and an output signal with a higher frequency may be acquired using increased numbers of oscillators and switching MOS transistors by applying the same principle as described above.

Figure 7:
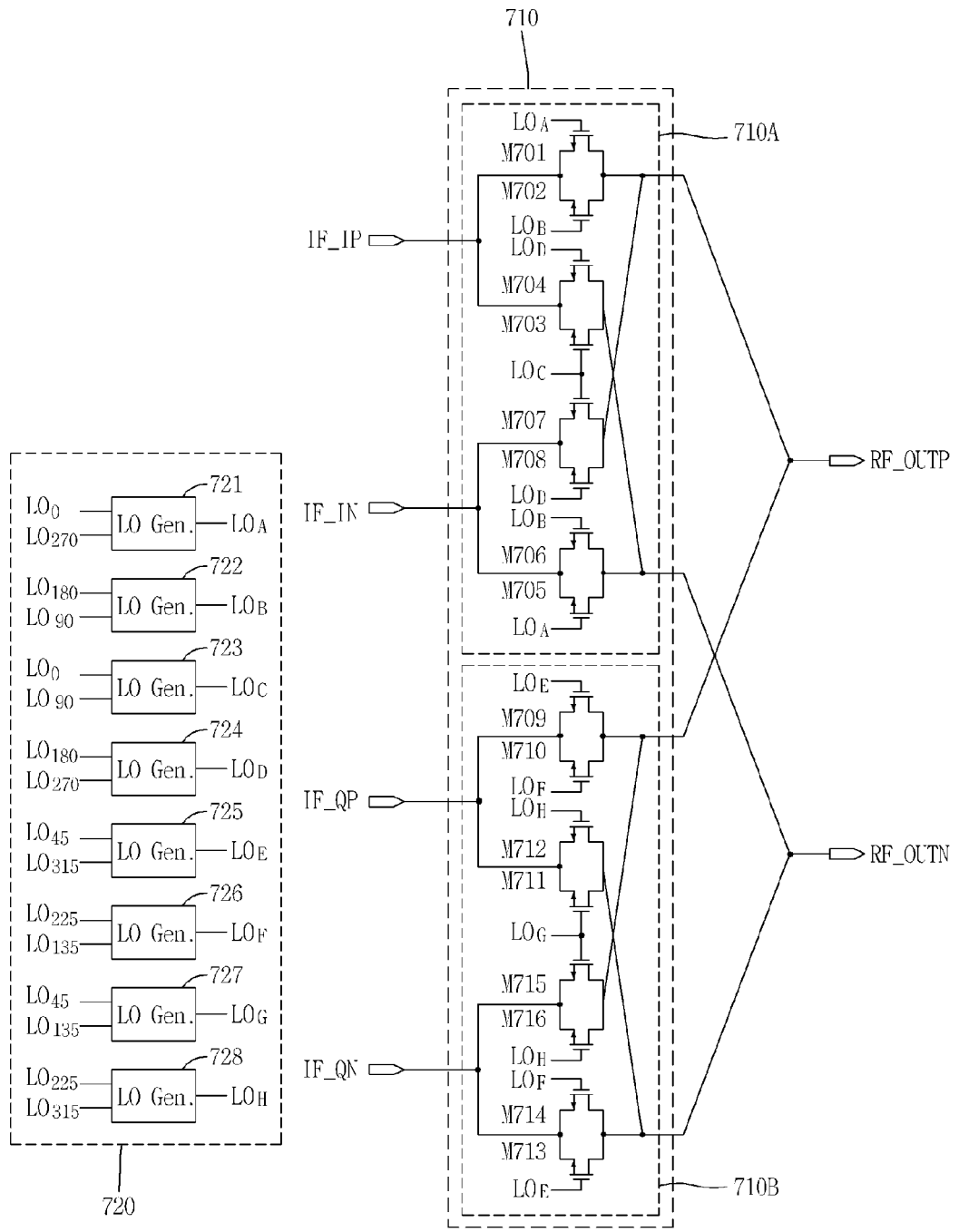
FIG. 7 is a block diagram of a double balanced frequency up converter in accordance with a fourth embodiment of the present invention; and In FIG. 8, (a) is a waveform diagram of frequency down conversion according to the conventional art, and (b) is a waveform diagram of frequency down conversion according to the present invention.

FIG. 7 is a block diagram of a double balanced frequency up converter in accordance with a fourth embodiment of the present invention. In FIG. 7, a double balanced frequency up converter includes a frequency up conversion unit 710 having a first mixer 710A and a second mixer 710B and a local oscillator signal generation unit 720 having a plurality of local oscillator signal generators 721 to 728.

Referring to FIG. 7, the first mixer 710A includes a pair of first and second MOS transistors M701 and M702 which are sequentially switched and transfer an I channel positive polarity intermediate frequency signal IF_IP to the output terminal of a positive polarity high frequency signal RF_OUTP, a pair of third and fourth MOS transistors M703 and M704 which are sequentially switched and transfer the I channel positive polarity intermediate frequency signal IF_IP to the output terminal of a negative polarity high frequency signal RF_OUTN, a pair of fifth and sixth MOS transistors M706 and M707 which are sequentially switched and transfer an I channel negative polarity intermediate frequency signal IF_IN to the output terminal of the negative polarity high frequency signal RF_OUTN, and a pair of seventh and eighth MOS transistors M707 and M708 which are sequentially switched and transfer the I channel negative polarity intermediate frequency signal IF_IN to the output terminal of the positive polarity high frequency signal RF_OUTP.

One terminals and the other terminals of the first MOS transistor M701 and the second MOS transistor M702 are commonly connected with each other, and one common connection terminal is connected to the input terminal of the I channel positive polarity intermediate frequency signal IF_IP and the other common connection terminal is connected to the output terminal of the positive polarity high frequency signal RF_OUTP. The gate of the first MOS transistor M701 is connected to the terminal of a local oscillator signal $LO_A$, and the gate of the second MOS transistor M702 is connected to the terminal of a local oscillator signal $LO_B$.

One terminals and the other terminals of the third MOS transistor M703 and the fourth MOS transistor M704 are commonly connected with each other, and one common connection terminal is connected to the input terminal of the I channel positive polarity intermediate frequency signal IF_IP and the other common connection terminal is connected to the output terminal of the negative polarity high frequency signal RF_OUTN. The gate of the third MOS transistor M703 is connected to the terminal of a local oscillator signal $LO_C$, and the gate of the fourth MOS transistor M704 is connected to the terminal of a local oscillator signal $LO_D$.

One terminals and the other terminals of the fifth MOS transistor M705 and the sixth MOS transistor M706 are commonly connected with each other, and one common connection terminal is connected to the input terminal of the I channel negative polarity intermediate frequency signal IF_IN and the other common connection terminal is connected to the output terminal of the negative polarity high frequency signal RF_OUTN. The gate of the fifth MOS transistor M705 is connected to the terminal of the local oscillator signal $LO_A$, and the gate of the sixth MOS transistor M706 is connected to the terminal of the local oscillator signal $LO_B$.

One terminals and the other terminals of the seventh MOS transistor M707 and the eighth MOS transistor M708 are commonly connected with each other, and one common connection terminal is connected to the input terminal of the I channel negative polarity intermediate frequency signal IF_IN and the other common connection terminal is connected to the output terminal of the positive polarity high frequency signal RF_OUTP. The gate of the seventh MOS transistor M707 is connected to the terminal of the local oscillator signal $LO_C$, and the gate of the eighth MOS transistor M708 is connected to the terminal of the local oscillator signal $LO_D$.

The second mixer 710B includes a pair of ninth and tenth MOS transistors M709 and M710 which are sequentially switched and transfer a Q channel positive polarity intermediate frequency signal IF_QP to the output terminal of the positive polarity high frequency signal RF_OUTP, a pair of eleventh and twelfth MOS transistors M711 and M712 which are sequentially switched and transfer the Q channel positive polarity intermediate frequency signal IF_QP to the output terminal of the negative polarity high frequency signal RF_OUTN, a pair of thirteenth and fourteenth MOS transistors M713 and M714 which are sequentially switched and transfer a Q channel negative polarity intermediate frequency signal IF_QN to the output terminal of the negative polarity high frequency signal RF_OUTN, and a pair of fifteenth and sixteenth MOS transistors M715 and M716 which are sequentially switched and transfer the Q channel negative polarity intermediate frequency signal IF_QN to the output terminal of the positive polarity high frequency signal RF_OUTP.

One terminals and the other terminals of the ninth MOS transistor M709 and the tenth MOS transistor M710 are commonly connected with each other, and one common connection terminal is connected to the input terminal of the Q channel positive polarity intermediate frequency signal IF_QP and the other common connection terminal is connected to the output terminal of the positive polarity high frequency signal RF_OUTP. The gate of the ninth MOS transistor M709 is connected to the terminal of a local oscillator signal $LO_E$, and the gate of the tenth MOS transistor M710 is connected to the terminal of a local oscillator signal $LO_F$.

One terminals and the other terminals of the eleventh MOS transistor M711 and the twelfth MOS transistor M712 are commonly connected with each other, and one common connection terminal is connected to the input terminal of the Q channel positive polarity intermediate frequency signal IF_QP and the other common connection terminal is connected to the output terminal of the negative polarity high frequency signal RF_OUTN. The gate of the eleventh MOS transistor M711 is connected to the terminal of a local oscillator signal $LO_G$, and the gate of the twelfth MOS transistor M712 is connected to the terminal of a local oscillator signal $LO_H$.

One terminals and the other terminals of the thirteenth MOS transistor M713 and the fourteenth MOS transistor M714 are commonly connected with each other, and one common connection terminal is connected to the input terminal of the Q channel negative polarity intermediate frequency signal IF_QN and the other common connection terminal is connected to the output terminal of the negative polarity high frequency signal RF_OUTN. The gate of the thirteenth MOS transistor M713 is connected to the terminal of the local oscillator signal $LO_E$, and the gate of the fourteenth MOS transistor M714 is connected to the terminal of a local oscillator signal $LO_F$.

One terminals and the other terminals of the fifteenth MOS transistor M715 and the sixteenth MOS transistor M716 are commonly connected with each other, and one common connection terminal is connected to the input terminal of the Q channel negative polarity intermediate frequency signal IF_QN and the other common connection terminal is connected to the output terminal of the positive polarity high frequency signal RF_OUTP. The gate of the fifteenth MOS transistor M715 is connected to the terminal of the local oscillator signal $LO_G$, and the gate of the sixteenth MOS transistor M716 is connected to the terminal of a local oscillator signal $LO_H$.

The local oscillator signal generation unit 720 generates the local oscillator signals $LO_A$ to $LO_H$ of the same patterns as those generated by the local oscillator signal generation unit 420 of FIG. 4.

Therefore, the first MOS transistor M701 and the fifth MOS transistor M705 of the first mixer 710A are simultaneously turned on by the local oscillator signal $LO_A$. According to this fact, the I channel positive polarity intermediate frequency signal IF_IP is transferred to the output terminal of the positive polarity high frequency signal RF_OUTP through the first MOS transistor M701. At the same time, the I channel negative polarity intermediate frequency signal IF_IN is transferred to the output terminal of the negative polarity high frequency signal RF_OUTN through the fifth MOS transistor M705.

Thereafter, the second MOS transistor M702 and the sixth MOS transistor M706 are simultaneously turned on by the local oscillator signal $LO_B$. According to this fact, the I channel positive polarity intermediate frequency signal IF_IP is transferred to the output terminal of the positive polarity high frequency signal RF_OUTP through the second MOS transistor M702. At the same time, the I channel negative polarity intermediate frequency signal IF_IN is transferred to the output terminal of the negative polarity high frequency signal RF_OUTN through the sixth MOS transistor M706.

Then, the third MOS transistor M703 and the seventh MOS transistor M707 are simultaneously turned on by the local oscillator signal $LO_C$. According to this fact, the I channel positive polarity intermediate frequency signal IF_IP is transferred to the output terminal of the negative polarity high frequency signal RF_OUTN through the third MOS transistor M703. At the same time, the I channel negative polarity intermediate frequency signal IF_IN is transferred to the output terminal of the positive polarity high frequency signal RF_OUTP through the seventh MOS transistor M707.

Next, the fourth MOS transistor M704 and the eighth MOS transistor M708 are simultaneously turned on by the local oscillator signal $LO_D$. According to this fact, the I channel positive polarity intermediate frequency signal IF_IP is transferred to the output terminal of the negative polarity high frequency signal RF_OUTN through the fourth MOS transistor M704. At the same time, the I channel negative polarity intermediate frequency signal IF_IN is transferred to the output terminal of the positive polarity high frequency signal RF_OUTP through the eighth MOS transistor M708.

The ninth MOS transistor M709 and the thirteenth MOS transistor M713 of the second mixer 710B are simultaneously turned on by the local oscillator signal $LO_E$. According to this fact, the Q channel positive polarity intermediate frequency signal IF_QP is transferred to the output terminal of the positive polarity high frequency signal RF_OUTP through the ninth MOS transistor M709. At the same time, the Q channel negative polarity intermediate frequency signal IF_QN is transferred to the output terminal of the negative polarity high frequency signal RF_OUTN through the thirteenth MOS transistor M713.

Thereafter, the tenth MOS transistor M710 and the fourteenth MOS transistor M714 are simultaneously turned on by the local oscillator signal $LO_F$. According to this fact, the Q channel positive polarity intermediate frequency signal IF_QP is transferred to the output terminal of the positive polarity high frequency signal RF_OUTP through the tenth MOS transistor M710. At the same time, the Q channel negative polarity intermediate frequency signal IF_QN is transferred to the output terminal of the negative polarity high frequency signal RF_OUTN through the fourteenth MOS transistor M714.

Then, the eleventh MOS transistor M711 and the fifteenth MOS transistor M715 are simultaneously turned on by the local oscillator signal $LO_G$. According to this fact, the Q channel positive polarity intermediate frequency signal IF_QP is transferred to the output terminal of the negative polarity high frequency signal RF_OUTN through the eleventh MOS transistor M711. At the same time, the Q channel negative polarity intermediate frequency signal IF_QN is transferred to the output terminal of the positive polarity high frequency signal RF_OUTP through the fifteenth MOS transistor M715.

Next, the twelfth MOS transistor M712 and the sixteenth MOS transistor M716 are simultaneously turned on by the local oscillator signal $LO_G$. According to this fact, the Q channel positive polarity intermediate frequency signal IF_QP is transferred to the output terminal of the negative polarity high frequency signal RF_OUTN through the twelfth MOS transistor M712. At the same time, the Q channel negative polarity intermediate frequency signal IF_QN is transferred to the output terminal of the positive polarity high frequency signal RF_OUTP through the sixteenth MOS transistor M716.

In this way, during one cycle of a local oscillator signal LO, each of the I channel intermediate frequency signals IF_IP and IF_IN is transferred two times to each of the output terminals of the high frequency signals RF_OUTP and RF_OUTN through each pair of four pairs of MOS transistors M701 and M702, M703 and M704, M705 and M706, and M707 and M708, and each of the Q channel intermediate frequency signals IF_QP and IF_QN is transferred two times to each of the output terminals of the high frequency signals RF_OUTP and RF_OUTN through each pair of the other four pairs of MOS transistors M709 and M710, M711 and M712, M713 and M714, and M715 and M716.

Accordingly, unlike the conventional double balanced frequency up conversion in which, during one cycle of the local oscillator signal LO, each of the I channel intermediate frequency signals IF_IP and IF_IN and the Q channel intermediate frequency signals IF_QP and IF_QN is transferred one time to each of the output terminals of the high frequency signals RF_OUTP and RF_OUTN through a one corresponding MOS transistor, it is possible to perform double balanced frequency up conversion in the same way even by using a local oscillator signal with one half frequency.

While it was described above that the respective pairs of MOS transistors M701 and M702, M703 and M704, M705 and M706, M707 and M708, M709 and M710, M711 and M712, M713 and M714, and M715 and M716 are used in correspondence to the respective I channel intermediate frequency signals IF_IP and IF_IN and Q channel intermediate frequency signals IF_QP and IF_QN, it is to be noted that the present invention is not limited to such and an output signal with a higher frequency may be acquired using increased numbers of oscillators and switching MOS transistors by applying the same principle as described above.

In other words, in the first to fourth embodiments of the present invention, by controlling the switching operations of the pairs of switching MOS transistors using the eight local oscillator signals $LO_A$, $LO_B$, $LO_C$, $LO_D$, $LO_E$, $LO_F$, $LO_G$ and $LO_H$ with the phase differences and duty ratios as described above, the frequency of the local oscillator signal LO to be down or up converted becomes one half of the frequency of the high frequency signal RF to be inputted or outputted. Through further decreasing the duty ratios (while increasing the number) of oscillator signals and correspondingly adding switching MOS transistors connected in parallel by using the same principle, the frequency of the local oscillator signal LO to be down or up converted may be decreased to one thirds, one fourths, etc. of the frequency of the high frequency signal RF to be inputted or outputted.

Figure 8:
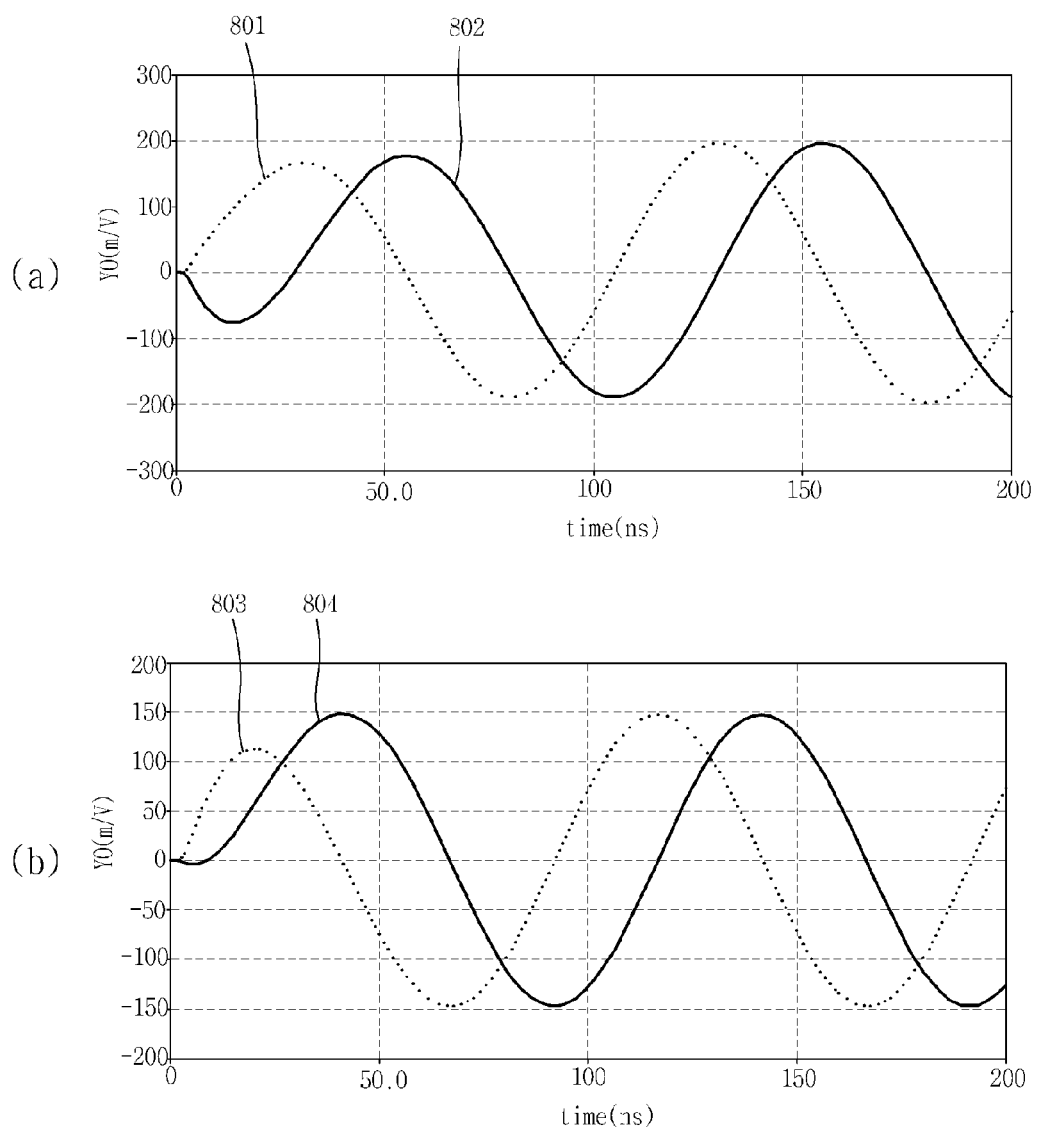

In FIG. 8, (a) is a waveform diagram of frequency down conversion according to the conventional art, and (b) is a waveform diagram of frequency down conversion according to the present invention. Here, the frequency of a high frequency signal (RF) is 2.01 GHz, and the frequency of a local oscillator signal (LO) is 1 GHz. Accordingly, the frequency of an intermediate frequency signal (IF) is 10 MHz. In (a) and (b) of FIG. 8, waveforms 801 and 803 are differential waveforms of an I channel positive polarity node (IP) and an I channel negative polarity node (IN), and waveforms 802 and 804 are differential waveforms of a Q channel positive polarity node (QP) and a Q channel negative polarity node (QN). The two waveforms 801 and 803 and 802 and 804 have a phase difference of 90°, and this means that a signal is orthogonally down converted. As a result, in the present invention, it can be seen that a signal is precisely down converted even though a local oscillator signal (LO) with a low frequency is used.

As is apparent from the above description, according to the embodiments of the present invention, when down converting a high frequency signal into an intermediate frequency signal or up converting an intermediate frequency signal into a high frequency signal by controlling switching elements using a local oscillator signal, a signal with a frequency to be converted is controlled a number of times during one cycle of the local oscillator signal, whereby the same frequency conversion performance may be achieved even by using the local oscillator signal with a lower frequency.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A frequency down converter for single-balanced down converting a frequency of a high frequency signal and transferring the high frequency signal to output terminals of an I channel positive polarity intermediate frequency signal, an I channel negative polarity intermediate frequency signal, a Q channel positive polarity intermediate frequency signal and a Q channel negative polarity intermediate frequency signal, the frequency down converter comprising:
    a first mixer including a plurality of MOS transistors which are connected in parallel to transfer the high frequency signal to the output terminal of the I channel positive polarity intermediate frequency signal a number of times with a predetermined phase difference, and a plurality of MOS transistors which are connected in parallel to transfer the high frequency signal to the output terminal of the I channel negative polarity intermediate frequency signal a number of times with a predetermined phase difference;
    a second mixer including a plurality of MOS transistors which are connected in parallel to transfer the high frequency signal to the output terminal of the Q channel positive polarity intermediate frequency signal a number of times with a predetermined phase difference, and a plurality of MOS transistors which are connected in parallel to transfer the high frequency signal to the output terminal of the Q channel negative polarity intermediate frequency signal a number of times with a predetermined phase difference; and
    a local oscillator signal generation unit configured to provide a plurality of local oscillator signals comprising preselected phases and pulse widths and equal in number to the pluralities of MOS transistors, the plurality of local oscillator signals arranged in local oscillator signal pairs, each local oscillator signal pair connected to respective gates of a given pair of MOS transistors connected in parallel to transfer the high frequency signal to the output terminals of the I channel positive polarity intermediate frequency signal, the I channel negative polarity intermediate frequency signal, the Q channel positive polarity intermediate frequency signal and the Q channel negative polarity intermediate frequency signal through the pluralities of MOS transistors, each local oscillator signal pair comprising a 180° phase difference and a 25% duty ratio and each local oscillator signal comprising a unique phase during one cycle.

2. The frequency down converter according to claim 1, wherein the first mixer comprises:
    first and second MOS transistors having one terminals and the other terminals which are commonly connected with each other such that one common connection terminal is connected to an input terminal of the high frequency signal and the other common connection terminal is connected to the output terminal of the I channel positive polarity intermediate frequency signal; and
    third and fourth MOS transistors having one terminals and the other terminals which are commonly connected with each other such that one common connection terminal is connected to the input terminal of the high frequency signal and the other common connection terminal is connected to the output terminal of the I channel negative polarity intermediate frequency signal.

3. The frequency down converter according to claim 1, wherein the second mixer comprises:
    fifth and sixth MOS transistors having one terminals and the other terminals which are commonly connected with each other such that one common connection terminal is connected to the input terminal of the high frequency signal and the other common connection terminal is connected to the output terminal of the Q channel positive polarity intermediate frequency signal; and
    seventh and eighth MOS transistors having one terminals and the other terminals which are commonly connected with each other such that one common connection terminal is connected to the input terminal of the high frequency signal and the other common connection terminal is connected to the output terminal of the Q channel negative polarity intermediate frequency signal.

4. The frequency down converter according to claim 1, wherein the first mixer comprises:
    a set of at least three MOS transistors which are connected in parallel to transfer the high frequency signal to the output terminal of the I channel positive polarity intermediate frequency signal at least three times and to the output terminal of the I channel negative polarity intermediate frequency signal at least three times, during the one cycle of the local oscillator signal, and
    wherein the second mixer comprises:
    a set of at least three MOS transistors which are connected in parallel to transfer the high frequency signal to the output terminal of the Q channel positive polarity intermediate frequency signal at least three times and to the output terminal of the Q channel negative polarity intermediate frequency signal at least three times, during the one cycle of the local oscillator signal.

* * * * *